United States Patent
Inoue et al.

(10) Patent No.: US 8,609,225 B2
(45) Date of Patent: Dec. 17, 2013

(54) ETHYLENE-UNSATURATED ESTER COPOLYMER FILM FOR FORMING LAMINATE

(75) Inventors: Yoshihiko Inoue, Yokohama (JP); Tetsuro Ikeda, Yokohama (JP)

(73) Assignee: Bridgestone Corporation, Tokyo (JP)

( * ) Notice: Subject to any disclaimer, the term of this patent is extended or adjusted under 35 U.S.C. 154(b) by 185 days.

(21) Appl. No.: 13/321,726

(22) PCT Filed: May 12, 2010

(86) PCT No.: PCT/JP2010/058002
§ 371 (c)(1),
(2), (4) Date: Dec. 15, 2011

(87) PCT Pub. No.: WO2010/134451
PCT Pub. Date: Nov. 25, 2010

(65) Prior Publication Data
US 2012/0107564 A1    May 3, 2012

(30) Foreign Application Priority Data
May 21, 2009    (JP) .................. 2009-123516

(51) Int. Cl.
*D06N 7/00* (2006.01)
*B32B 17/10* (2006.01)
*B32B 3/00* (2006.01)

(52) U.S. Cl.
USPC ........... 428/141; 428/156; 428/409; 428/442; 136/259

(58) Field of Classification Search
USPC ................... 428/141, 156, 409, 442; 136/259
See application file for complete search history.

(56) References Cited

U.S. PATENT DOCUMENTS 4,925,725 A * 5/1990 Endo et al. ............. 428/156
6,093,471 A * 7/2000 Hopfe et al. ............. 428/141

FOREIGN PATENT DOCUMENTS

| JP | 07-178812 A   | 7/1995 |
| JP | 2000-203901 A | 7/2000 |
| JP | 2001-130931 A | 5/2001 |
| JP | 2002-185027 A | 6/2002 |
| JP | 2005-213068 A | 8/2005 |

* cited by examiner

Primary Examiner — Donald J Loney
(74) Attorney, Agent, or Firm — Sughrue Mion, PLLC

(57) ABSTRACT

The object of the present invention to provide an ethylene-unsaturated ester copolymer film used for forming a laminate, which is provided with emboss having effect on prevention on blocking during storage of the film, and which has good tackiness that is required for alignment in a laminating step. A film 40 for forming a laminate, which is formed from a composition comprising an ethylene-unsaturated ester copolymer and has emboss only on one surface 41 of the film, wherein a surface 42 opposite to the surface having emboss is provided with a fine asperity 43, the surface 42 provided with the fine asperity 43 having a surface roughness profile with a mean spacing between peaks (Sm) of 600 to 1600 μm and an arithmetical mean roughness (Ra) of 1.2 to 2.2 μm.

6 Claims, 3 Drawing Sheets

(A)

(B)

ETHYLENE-UNSATURATED ESTER COPOLYMER FILM FOR FORMING LAMINATE

CROSS REFERENCE TO RELATED APPLICATIONS

This application is a National Stage of International Application No. PCT/JP2010/058002 filed May 12, 2010, claiming priority based on Japanese Patent Application No. 2009-123516, filed May 21, 2009, the contents of all of which are incorporated herein by reference in their entirety.

TECHNICAL FIELD

The present invention relates to an ethylene-unsaturated ester copolymer film, which is used for forming a laminate, such as a solar cell sealing film or an intermediate film for a laminated glass, particularly a film, which is provided with emboss having effect on prevention of blocking or the like during storage of the film, and which has good tackiness (i.e., power to adhere to an adherend in a short time by weak power) that is required for alignment in a laminating process.

BACKGROUND ART

Conventionally, a film formed from a composition comprising an ethylene-unsaturated ester copolymer (hereinafter abbreviated to an ethylene-unsaturated ester copolymer film) such as an ethylene-vinyl acetate copolymer (hereinafter abbreviated to EVA) is used for forming a laminate in the form of a solar cell sealing film and an intermediate film for a laminated glass. When an ethylene-unsaturated ester copolymer film is used in an intermediate film for a laminated glass by interposing between glass plates, the film shows functions such as penetration resistance (passing through resistance) and prevention of scattering of broken glass. Further, when the film is used in a solar cell sealing film by arranging on the front side and the backside of photovoltaic elements, the film shows functions such as ensuring an electrical insulation property and a mechanical durability.

A laminated glass is, for instance, as shown in FIG. 3, prepared by interposing an intermediate film 5 between glass plates 7A and 7B to give a laminate, and preliminary pressing the laminate under reduced pressure to degas remaining air in each layer, and subsequently pressing it under heating whereby the laminate is adhesively combined.

Furthermore, a solar cell is generally, as shown in FIG. 4, prepared by superposing a transparent front side protection material 11 (e.g., glass plate), a front side sealing film 13A, plural photovoltaic elements 14 (e.g., photovoltaic elements made of silicon), a backside sealing film 13B and a backside protection material 12 (backside covering member) in this order to give a laminate, and preliminary pressing the laminate under reduced pressure to degas remaining air in each layer, and subsequently pressing it under heating whereby the laminate is adhesively combined by crosslinking or curing a front side sealing film 13A and a backside sealing film 13B.

The ethylene-unsaturated ester copolymer films need to be free from occurrence of the phenomenon that the films adhere to each other to form a block during storage of the films (hereinafter referred to as blocking). Furthermore, the films need to have a good workability in the laminating step in the process for preparing the laminates such as a laminated glass and a solar cell, and a good degassing property in the preliminary pressing step. In case the degassing is insufficient, reduced transparency of the resultant laminated glass, and reduced generating efficiency of the resultant solar cell may occur. Furthermore, the resultant solar cell is apt to be insufficient in durability, and to blister in long-term use.

An intermediate film for a laminated glass and a solar cell sealing film having a fine concavo-convex shape pattern (referred to as emboss) on one surface or both surfaces of the film have been developed (Patent Documents 1 and 2). The films correspond to an ethylene-unsaturated ester copolymer film satisfying the above-mentioned requirements. Furthermore, for example, as a process for preparing a film provided with emboss on both surfaces of the film, a process for preparing a film, wherein relationships among a surface roughness of one roll surface and another roll surface of a pair of emboss rolls (i.e., rolls for providing emboss to the film), a roll temperature and a pressure exerted by rolls are defined, has been developed (Patent Document 3).

PRIOR ART DOCUMENTS

Patent Document

Patent Document 1: JP(TOKKAI) 2001-130931 A
Patent Document 2: JP(TOKKAI) 2002-185027 A
Patent Document 3: JP(TOKKAI) 7 (1995)-178812 A

SUMMARY OF THE INVENTION

Problem to be Solved by the Invention

The ethylene-unsaturated ester copolymer films provided with emboss are effective on prevention of blocking during storage of the films, and improvement of degassing property of the laminates in the preparation thereof. However, the films are not necessarily good with respect to the workability in the laminating step in the process for preparing. In more detail, in order to improve the workability in the laminating step, it is necessary that the films have tackiness (i.e., power to adhere to an adherend in a short time by weak power). The tackiness enables the film to laminate on a glass plate, etc. with precise alignment. However, emboss formed on both sides of the film reduces the tackiness, and makes the film easy to slide, whereby it is difficult to align the film precisely.

In order to address the problem, it is thought to use a film provided with emboss only on one surface, and to align the film with the surface opposite to the surface provided with emboss (hereinafter abbreviated to non-embossed surface). However, studies of the inventors of the invention revealed that non-embossed surface having good tackiness cannot be necessarily obtained by preparing a film provided with emboss only on one surface.

It is therefore an object of the present invention to provide an ethylene-unsaturated ester copolymer film used for forming a laminate, which is provided with emboss having effect on prevention of blocking during storage of the film, and which has good tackiness that is required for alignment in a laminating step.

Means for Solving Problem

The above object is attained by a film for forming a laminate, which is formed from a composition comprising an ethylene-unsaturated ester copolymer and which has emboss only on one surface of the film,
wherein a surface opposite to of the surface having emboss (i.e., non-embossed surface) is provided with a fine asperity, the surface provided with the fine asperity having a surface roughness profile with a mean spacing between peaks (Sm) of 600 to 1600 μm and an arithmetical mean roughness (Ra) of 1.2 to 2.2 μm.

In the case of providing emboss only on one surface of a resin film, rolling process made between an emboss roll for transferring emboss and a pressure roll faced the reverse side of the emboss roll is generally adopted. The pressure roll is commonly made of rubber having a specific elasticity for sufficiently transferring a concavo-convex shape pattern of the emboss roll to the resin film. Heretofore, a lot of studies have been made with respect to methods for regulating surface condition of a surface provided with emboss (hereinafter abbreviated to embossed surface), including a method for providing emboss on both surface of the film, as described in Patent Document 3. However, there were few studies as to the surface condition of a non-embossed surface, which is formed when emboss is provided only on one surface of a film.

Commonly, a rubber pressure roll does not have a smooth surface like a metallic surface, but has a fine asperity because of the inherent material properties. As a result, the fine asperity of the roll may be transferred to a so-called non-embossed surface of a film. The inventors of the invention found that a film for forming a laminate, which is equipped with a non-embossed surface having good tackiness, can be obtained by setting a surface roughness profile of the non-embossed surface consisting of a mean spacing between peaks (Sm) and an arithmetical mean roughness (Ra) to the specified ranges.

Preferred embodiments of the film for forming a laminate according to the present invention are described as follows:

(1) The mean spacing between peaks (Sm) of the fine asperity of the surface opposite to the surface having emboss is 600 to 1200 μm.

(2) The arithmetical mean roughness (Ra) of the surface opposite to the surface having emboss is 1.7 to 2.2 μm.

(3) The film for forming a laminate as defined in any of claims 1 to 3, wherein the ethylene-unsaturated ester copolymer is ethylene-vinyl acetate copolymer.

(4) The film for forming a laminate as defined in claim 4, wherein the content of vinyl acetate recurring unit in the ethylene-vinyl acetate copolymer is 20 to 35 parts by weight based on 100 parts by weight of the ethylene-vinyl acetate copolymer.

(5) The film for forming a laminate as defined in any of claims 1 to 5, wherein the film is an intermediate film for a laminated glass or a solar cell sealing film. The film for forming a laminate according to the invention has good tackiness on the non-embossed surface, and hence the film especially is effective as an intermediate film for a laminated glass or a solar cell sealing film that requires precise alignment in a laminating step.

Advantageous Effects of the Invention

The ethylene-unsaturated ester copolymer film for forming a laminate according to the present invention is provided with emboss having effect on prevention of blocking during storage of the film and improvement of degassing property of the laminate in the preparation thereof. Furthermore, the film has good tackiness that is required for alignment in a laminating step. Therefore the invention provides an intermediate film for a laminated glass or a solar cell sealing film, which has good adhesion and good workability in the process for preparing.

BRIEF DESCRIPTION OF THE DRAWINGS

FIG. 2 (A) is a whole schematic section view. FIG. 2 (B) is an enlarged schematic section view of a contact portion between rolls and a film (portion surrounded by broken line in FIG. 2 (A)).

DESCRIPTION OF EMBODIMENTS

Figure 1:
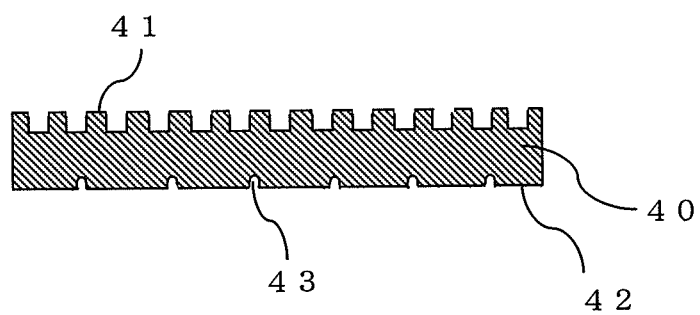
FIG. 1 is a schematic section view of a typical example of an ethylene-unsaturated ester copolymer film for forming a laminate of the invention.

The ethylene-unsaturated films for forming a laminate of the invention are explained with reference to the drawings below. FIG. 1 is a schematic section view of a typical example of an ethylene-unsaturated ester copolymer film for forming a laminate of the invention.

As shown in FIG. 1, a film 40 for forming a laminate of the invention has emboss only on one surface (embossed surface 41) of the film, and an opposite surface (non-embossed surface 42) of the surface 41 is provided with a fine asperity 43. Further, the non-embossed surface 42 provided with the fine asperity 43 has a surface roughness profile with a mean spacing between peaks (Sm) of 600 to 1600 μm and an arithmetical mean roughness (Ra) of 1.2 to 2.2 μm. The surface conditions enable non-embossed surface 42 to have good tackiness. An average thickness of the film 40 for forming a laminate is generally in the range of 50 μm to 2 mm, although it depends on the intended use. Especially, it is preferably in the range of 100 μm to 1.5 mm.

Figure 2:
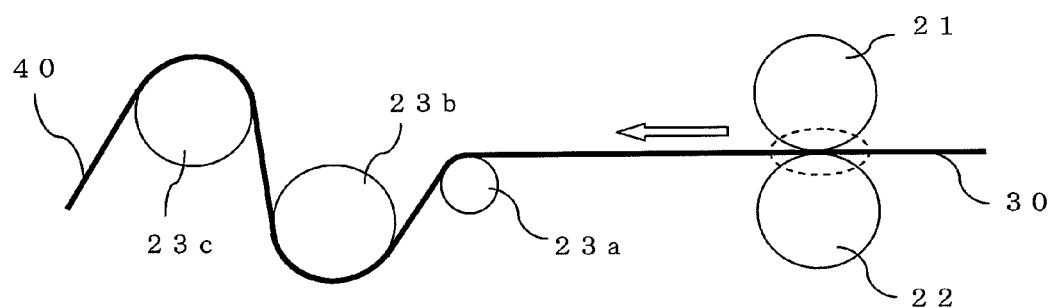
FIG. 2 is a view showing a typical example of a process for preparing an ethylene-unsaturated ester copolymer film for forming a laminate of the invention.
Figure 2:
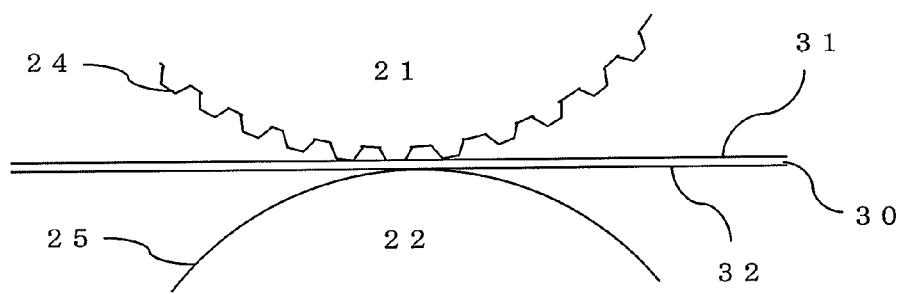

FIG. 2 (A) is a schematic section view showing a typical example of a process for preparing a film for forming a laminate of the invention. FIG. 2 (B) is an enlarged schematic section view of a contact portion between rolls and a film. As shown in FIG. 2 (A), in order to obtain a film for forming a laminate of the invention, first, a film 30 formed from a composition comprising an ethylene-unsaturated ester copolymer is inserted between an emboss roll 21 and a pressure roll 22 placed on the opposite side of the emboss roll 21. The emboss roll 21 is made of metal such as stainless steel, and has a fine concavo-convex shape pattern. The pressure roll 22 is made of rubber such as silicone rubber or chloroprene rubber. Then the film 30 is transported in the direction of an arrow in FIG. 2 (A), and rolled by applying heat and pressure between the emboss roll 21 and the pressure roll 22, whereby the fine concavo-convex shape pattern of the emboss roll 21 is transferred to the film 30. A temperature of the emboss roll 21 is, for instance, preferably 20 to 40° C., especially 20 to 30° C., although it depends on a composition of the film 30.

Subsequently, the film 30 is transported under a tensioned condition by a second guide roll 23b and a third guide roll 23c, via a first guide roll 23a, and cooled, whereby a film 40 for forming a laminate is obtained. Generally, the resultant film 40 for forming a laminate is rolled up in the form of a roll (not shown in the figure), and stored until the use.

For example, the film 30 can be prepared as described below. A composition comprising an ethylene-unsaturated ester copolymer and a crosslinker, etc. is introduced into a mixing roll or the like, and kneaded under melting, and then the kneaded composition is formed in the form of film to give a film. Heretofore known processes can be used as the method for forming film. Examples of the known processes include calendar molding (calendaring), extrusion molding, injection molding, hot pressing. Calendar molding is especially useful because a film having uniform thickness can be produced with rapidity. Calendar molding is a method for forming film comprising mixing a composition, for example, by kneading under melting, and then introducing the mixed composition into heating rolls and rolling the heated composition. A mixing temperature of the composition is, for instance, preferably 40 to 90° C., especially 60 to 80° C., although it depends on a composition. Furthermore, where the composition comprises a crosslinker, a temperature of heating rolls is preferably a temperature that the crosslinker cause no reaction or little reactions. For example, it is preferably 40 to 90° C., especially 50 to 80° C. For preparing the film 30, an apparatus carrying out boss steps for preparing film and forming emboss in a continuous way or an apparatus conducting only step for preparing film 30 preliminarily can be adopted.

A rolling step using the emboss roll 21 is explained in detail below. As shown in FIG. 2 (B), the concavo-convex shape pattern 24 of the emboss roll 21 is pressed on a surface 31 to be embossed of the film 30. Consequently, the concavo-convex shape pattern 24 is sufficiently transferred to the surface 31 to be embossed due to an elasticity of the pressure roll 22 made of rubber to form an embossed surface. In this case, the non-embossed surface 32 of the film 30 is pressed on a roll surface 25 of the pressure roll 22 made of rubber. Generally, the roll surface 25 is not smooth like metallic surface but has a fine asperity, because the pressure roll 22 is made of rubber. Therefore, the fine asperity on the roll surface 25 of the pressure roll 22 made of rubber is partially transferred to the non-embossed surface 32 of the film 30. The non-embossed surface 32 does not have occasionally good tackiness due to the transferred fine asperity.

In the invention, the non-embossed surface of the film 40 for forming a laminate is provided with a fine asperity formed by the roll surface 25 of the pressure roll 22 made of rubber. A surface condition of the non-embossed surface of the film 40 for forming a laminate is affected by a pressure of the emboss roll 21, a condition of the roll surface 25 of the pressure roll 22 made of rubber, and a tension acting on the film 30 during transport. In the invention, those conditions are controlled so that the non-embossed surface provided with a fine asperity has a surface roughness profile with a mean spacing between peaks (Sm) of 600 to 1600 µm and an arithmetical mean roughness (Ra) of 1.2 to 2.2 µm. This surface condition enables the non-embossed surface to have good tackiness. Considering an emboss transferring property of the embossed surface of the film, and a shrinkage relaxation property of the film, a mean spacing between peaks (Sm) of the fine asperity of the non-embossed surface is preferably 600 to 1200 µm. Furthermore, an arithmetical mean roughness (Ra) of the non-embossed surface is preferably 1.7 to 2.2 µm.

An arithmetical mean roughness (Ra) of the roll surface 25 of the pressure roll 22 is generally 0.1 to 15 µm, preferably 0.5 to 2.5 µm, more preferably 0.5 to 1.5 µm, especially 1.0 to 1.5 µm. Furthermore, a pressure of the emboss roll 21 is generally 0.1 to 3.0 MPa, preferably 0.1 to 1.0 MPa, more preferably 0.1 to 0.5 MPa, especially 0.1 to 0.3 MPa.

Additionally, the form of a concavo-convex shape pattern and an arithmetical mean roughness (Ra) of the embossed surface of the film 40 for forming a laminate are not particularly restricted, as long as the emboss is formed to prevent blocking during storage of the film, and to improve degassing property in the preparation. For example, the emboss can be formed as a convex in the form of a circular, semicircular or polygonal, at regular intervals space. Further, the emboss can be formed to have a striped pattern or a meshed pattern. Especially, it is preferred that a concavo-convex shaped pattern has a striped pattern in view of productivity. Further-more, an arithmetical mean roughness (Ra) of the embossed surface is generally 3 to 50 µm, preferably 5 to 10 µm.

In the invention, an arithmetical mean roughness (Ra) is measured according to JIS-B0601 (1994), as follows. A reference length in the direction of a mean line is sampled from the roughness chart. The average absolute value of the deviation from the mean line to the measured curve of the reference length is calculated.

Furthermore, a mean spacing between peaks (Sm) is measured according to JIS-B0601 (1994), as follows. A reference length in the direction of a mean line is sampled from the roughness chart. The average length of a mean line corresponding to a peak and a neighboring valley of the reference length is calculated.

Additionally, "good tackiness" in the invention preferably satisfies an adherence power (measured by a tackiness meter (MODEL: DPX-SOT, manufactured by IMADA Co., LTD) of 0.4N or more, which is determined by bringing a non-embossed surface of a film into contact with a glass plate, and applying load of 500 g for 90 sec on the film, and then peeling off the film at a rate of 300 mm/min.

<Ethylene-Unsaturated Ester Copolymer>

In the invention, an ethylene-unsaturated ester copolymer is not particularly restricted, and can be employed depending on the intended use. Examples of the unsaturated ester monomer of the ethylene-unsaturated ester copolymer include such as vinyl esters such as vinyl acetate and vinyl propionate and unsaturated carboxylic acids esters, such as methyl acrylate, ethyl acrylate, isobutyl acrylate, n-butyl acrylate, isoctyl acrylate, methyl methacrylate, isobutyl methacrylate, dimethyl maleate and diethyl maleate.

Examples of the ethylene-unsaturated ester copolymer include ethylene-vinyl ester copolymer such as ethylene-vinyl acetate copolymer (EVA), and ethylene-unsaturated carboxylic acid ester copolymers such as ethylene-ethyl acrylate copolymer (EEA), ethylene-methyl methacrylate copolymer. In particular, ethylene-vinyl acetate copolymer is preferred because a resultant film for forming a laminate shows excellent adhesion and transparency.

The content of vinyl acetate recurring unit in the EVA is not particularly restricted, and can be selected depending on the intended use. The content of vinyl acetate recurring unit is preferably in the range of 20 to 35 parts by weight, more preferably 20 to 30 parts by weight, especially 24 to 28 parts by weight based on 100 parts by weight of EVA. The less content of vinyl acetate, the harder EVA composition is obtained. On the other hand, when the content is less than 20 parts by weight, the composition of EVA is apt not to show sufficiently high transparency. Furthermore, when the content is more than 35 parts by weight, a resin film formed from the EVA composition tends to have insufficient hardness.

In the invention, the composition forming the film can be prepared by adding, if necessary, crosslinker, crosslinking auxiliary agent, adhesion improver, a plasticizer, etc. to an ethylene-unsaturated ester copolymer.

<Crosslinker>

An organic peroxide that can be decomposed at a temperature of not less than 100° C. to generate radical(s) can be employed as the crosslinker. The organic peroxide is selected in the consideration of film-forming temperature, conditions for preparing the composition, curing (crosslinking) temperature, heat resistance of body to be bonded, storage stability. Particularly, preferred are those having a decomposition temperature of not less than 70° C. in a half-life of 10 hours. From the viewpoint of resin processing temperature and storage stability, examples of the organic per-oxides include compounds having a bifunctional peroxymonocarbonate structure, such as 1,4-bis(tert-butylperoxycarbonyloxy)hexane, 1,5-bis(tert-butylperoxycarbonyloxy)hexane, 1,6-bis(tert-butylperoxycarbonyloxy)hexane, 2,2-dimethyl-1,3-bis(tert-butylperoxycarbonyloxy)propane, benzoyl peroxide-type cure agent, such as benzoyl peroxide, 2,5-dimethylhexyl-2,5-bisperoxybenzoate, tert-butylperoxy-2-ethylhexyl monocarbonate, 1,1-bis(tert-hexylperoxy)-3,3,5-trimethylcyclohexane, tert-hexyl peroxypivalate, tert-butyl peroxypivalate, 3,5,5-trimethylhexanoyl peroxide, di-n-octanoyl peroxide, lauroyl peroxide, stearoyl peroxide, 1,1,3,3-tetramethylbutylperoxy-2-ethyl hexanoate, succinic acid peroxide, 2,5-dimethyl-2,5-di(2-ethylhaxanoylperoxy)hexane, 1-cyclohexyl-1-methylethylperoxy-2-ethylhexanoate, tert-hexylperoxy-2-ethylhexanoate, 4-methylbenzoyl peroxide, tert-butylperoxy-2-ethyl hexanoate, m-toluoyl+benzoylperoxide, benzoyl peroxide, 1,1-bis(tert-butylperoxy)-2-methylcyclohexane, 1.1-bis(tert-hexylperoxy)-3,3,5-trimethylcyclohexane, 1,1-bis(tert-hexylperoxy)cyclohexane, 1,1-bis(tert-butylperoxy)cyclohexane, 2,2-bis(4,4-di-tert-butylperoxycyclohexyl)propane, 1,1-bis(tert-butylperoxy) cyclododecane, tert-hexylperoxyisopropyl monocarbonate, tert-butylperoxy maleic acid, tert-butylperoxy-3,3,5-trimethyl hexanoate, tert-butyl peroxylaurate, 2,5-dimethyl-2,5-di(methylbenzoylperoxy)hexane, tert-butylperoxyisopropyl monocarbonate, tert-hexyl peroxybenzoate, and 2,5-dimethyl-2,5-di(benzoylperoxy)hexane. The crosslinkers can be used singly, or in combination of two more kinds. The content of the cross-linker in the composition is preferably in the range of 0.05 to 5 parts by weight, more preferably 0.1 to 3 parts by weight, in particular 0.5 to 2.5 parts by weight based on 100 parts by weight of ethylene-unsaturated ester copolymer.

<Others>

The crosslinking auxiliary agent enables increase of gel fraction of ethylene-unsaturated ester copolymer and improvement of adhesive property and durability of the film for forming a laminate. Examples of the cross-linking auxiliary agents (compounds having a radical polymerizable group as functional group) include tri-functional cross-linking auxiliary agents such as triallyl cyanurate and triallyl isocyanurate, mono- or di-functional crosslinking auxiliary agents of (meth)acryl esters (e.g., NK Ester, etc.). Among these compounds, triallyl cyanurate and triallyl isocyanurate are preferred, and triallyl isocyanurate is particularly preferred. The crosslinking auxiliary agent is generally used in an amount of 10 parts by weight or less, preferably in the range of 0.1 to 5.0 parts by weight, based on 100 parts by weight of ethylene-unsaturated ester copolymer.

A silane-coupling agent can be employed as the adhesion improver. Examples of the Silane-coupling agents include γ-chloropropylmethoxysilane, vinylethoxysilane, vinyl-tris (β-methoxyethoxy)silane, γ-methacryloxypropyltrimethoxysilane, vinyltriacetoxysilane, γ-glycidoxypropyltrimethoxysilane, γ-glycidoxypropyltriethoxysilane, β-(3,4-epoxycyclohexyl)ethyltrimethoxysilane, vinyltrichlorosilane, γ-mercaptopropyltrimethoxysilane, γ-aminopropyltriethoxysilane and N-β-(aminoethyl)-γ-aminopropyltrimethoxysilane. The silane-coupling agents can be used singly, or in combination of two or more kinds. Furthermore, the content of the adhesion improver is preferably 5 parts by weight or less based on 100 parts by weight of ethylene-unsaturated ester copolymer.

As the plasticizers, for example, phosphorous-containing compounds, such as phosphites including triisodecyl phosphite, tris(nonylphenyl)phosphite, etc. and phosphate esters, etc., polybasic acid esters, such as adipic acid ether ester, n-octyl trimellitate, diocctyl phthalate, dihexyl adipate, dibutyl sebacate, etc., polyhydric alcohol esters, such as 2,2,4-trimethyl-1,3-pentandioldiisobutyrate, triethylene glycol-di-2-ethylbutyrate, tetraethylene glycol diheptanoate and triethylene glycol dipelargonate, etc., and epoxidized fatty acid alkyl ester can be employed.

Furthermore, in the composition of the present invention, additives other than mentioned above may be further employed, depending on the intended use of the film for forming a laminate. For example, when the film is used as an intermediate film for a laminated glass or a solar cell sealing film, the composition may further contain various additives such as acryloxy group-containing compounds, methacryloxy group-containing compounds, epoxy group-containing compounds, ultraviolet absorbent, light stabilizer, and/or antioxidant for improvement or adjustment of various properties of the film (e.g., mechanical strength, adhesion property, optical characteristics such as transparency, heat-resistance, light-resistance, or crosslinking rate, etc.), if necessary.

<Intended Use>

The film for forming a laminate of the invention is provided with emboss on one surface of the film, whereby prevention of blocking during storage of the films and degassing property of the laminates in the preparation are ensured, and further provided with the non-embossed surface of the film having good tackiness. Therefore, the film can be preferably used as an intermediate film for a laminated glass or a solar cell sealing film, which requires accurate alignment in a laminating step.

When the film is used as an intermediate film for a laminated glass, the film for forming a laminate (an intermediate film) of the invention is generally interposed between two transparent substrates to give a laminate, and the laminate is adhesively combined, thereby preparing a laminated glass. Glass plates such as silicate glass plate, inorganic glass plate and color free transparent glass plate, as well as plastic film substrates can be used as the transparent substrate. Examples of the plastic film substrates include polyethylene terephthalate (PET) film, polyethylene naphthalate (PEN) film or polyethylene butyrate film. PET film is preferred. The thickness of the transparent substrate is generally in the range of 0.05 to 20 mm.

Figure 3:
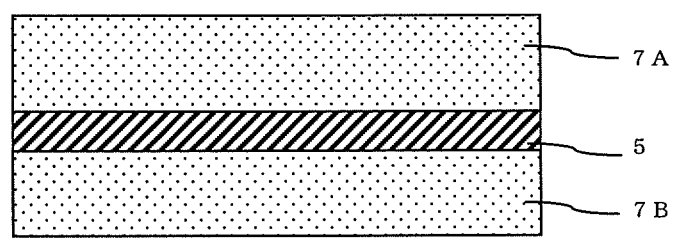
FIG. 3 is a schematic section view for explaining a conventional laminated glass.

In order to prepare the laminated glass, for instance, as shown in FIG. 3, an intermediate film 5 is interposed between two transparent substrates 7A and 7B to give a laminate, and the laminate is degassed under reduced pressure, and then pressed under heating (high temperature laminating step). The pressing under heating brings about crosslinking or curing of an ethylene-unsaturated ester copolymer in the intermediate film whereby the laminate are adhesively combined. The crosslinking or curing step is generally carried out by heating the laminate at a temperature of 100 to 150° C., especially approx. 130° C., for 10 to 120 minutes, preferably 10 to 60 minutes. The crosslinking or curing can be carried out, for example, after preliminarily pressing under heating the laminate at a temperature of 80 to 120° C. The heating treatment is particularly preferably performed, for example, at a temperature of 130° C. (atmosphere temperature), for 10 to 30 minutes. Furthermore, the heating treatment is preferably performed in conjunction with pressing the laminate under a pressure of 0 to 800 kPa. The crosslinked laminate is generally cooled at room temperature. The cooling is preferably conducted rapidly.

Furthermore, when the film is used as a solar cell sealing film, generally, the film for forming a laminate (a solar cell sealing film) of the invention is interposed between a transparent front side protection material and a backside sealing film to give a laminate, and the laminate is adhesively combined to seal photovoltaic elements therebetween, thereby preparing a solar cell. In order to sufficiently seal photovoltaic elements, a transparent front side protection material, a front side sealing film, photovoltaic elements, a backside sealing film and a backside protection material are superposed in this order to obtain a laminate. Then the laminate is preliminary pressed under reduced pressure to degas remaining air in each layers, subsequently pressed under heating whereby the laminate is adhesively combined by crosslinking or curing a front side sealing film.

In the invention, "front side" corresponds to a light-irradiated side of the photovoltaic element (light-receiving side), whereas "backside" corresponds to the reverse side of the light-receiving side.

Figure 4:
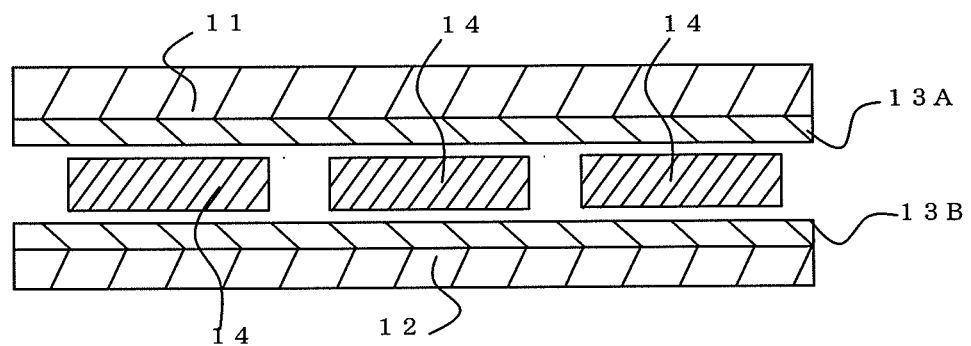
FIG. 4 is a schematic section view for explaining a conventional solar cell.

For sufficiently sealing the photovoltaic elements in the solar cell, for instance, a transparent front side protection material 11, a front side sealing film 13A, photovoltaic elements 14, and a backside protection material 12 are laminated in this order, and thereafter, the sealing film is crosslinked or cured according to a conventional process such as the application of heating and pressure, as shown in FIG. 4.

For performance of the application of heating and pressure, the laminate can be introduced into a vacuum laminator and pressed under heating in the conditions of temperature of 135 to 180° C., preferably 140 to 180° C., especially 155 to 180° C., degassing time period of 0.1 to 5 minutes, pressing pressure of 0.1 to 1.5 kg/cm$^2$ and pressing time period of 5 to 15 min. This heating enables the ethylene-vinyl acetate copolymer contained in the front side sealing film 13A and the backside sealing film 13B to crosslink, whereby the photovoltaic elements 14, the transparent front side protection material 11 and the backside protection material 12 are combined through the front side sealing film 13A and the backside sealing film 13B to seal the photovoltaic elements 14.

Additionally, the film for forming a laminate (a solar cell sealing film) of the invention can be used for not only a solar cell using single-crystalline or polycrystalline silicon crystal type photovoltaic elements as shown in FIG. 4, but also thin-film solar cells, such as a thin-film silicon type solar cell, an amorphous silicon film type solar cell, and a copper indium selenide (CIS) type solar cell. Examples of a structure of thin-film solar cell include;

a structure that a thin-film photovoltaic element formed on surface of a transparent front side protection material for example a transparent substrate such as a glass substrate, a polyimide substrate, and a fluorine resin type transparent substrate by sputtering method or chemical vapor deposition method and a backside protection material are adhesively combined with each other by a back side solar cell sealing film interposed therebetween, a structure that a thin-film photovoltaic element formed on a surface of a backside protection material and a transparent front side protection material are adhesively combined with each other by a front side solar cell sealing film interposed therebetween, and a structure that a thin-film photovoltaic element between a transparent front side protection material and a backside protection material are adhesively combined with each other by a front side solar cell sealing film and a backside solar cell sealing film interposed therebetween.

The transparent front side protection material 11 for use in the solar cell of the invention is generally a glass substrate such as silicate glass. The thickness of the glass substrate is generally in the range of 0.1 to 10 mm, preferably 0.3 to 5 mm. The glass substrate can be chemically or thermally tempered.

The backside protection material 12 used in the invention is preferably a plastic film such as polyethylene terephthalate (PET). From the viewpoint of heat resistance and moisture resistance, fluorinated polyethylene film (polyfluoroethylene film), especially a laminated film of fluorinated polyethylene film/Al/fluorinated polyethylene film in this order can be employed.

EXAMPLES

The invention is illustrated in detail using the following Examples.

Preparation of a Film for Forming a Laminate

Examples 1 to 8 and Comparative Examples 1 to 3

Materials shown in the following formulation:
EVA (content of vinyl acetate based on 100 wt. parts of EVA: 26 wt. parts); 100 weight parts,
Crosslinker (2,5-dimethyl-2,5-di(tert-butylperoxy)hexane); 1 weight parts,
Crosslinking auxiliary (triallyl isocyanurate); 2 weight parts, and
Silane coupling agent (γ-methacryloxypropyl trimethoxy silane); 0.5 weight part,
were supplied to a roll mill, and kneaded at 70° C. to prepare an EVA composition. The EVA composition was molded by calendaring at temperature of 70° C. to prepare a film. Subsequently, emboss was formed on a surface to be embossed of the film by using a emboss roll having a concavo-convex shape pattern provided with a convex of a striped pattern (an arithmetical mean roughness (Ra); 10 μm), and a pressure roll made of rubber whose surface has an arithmetical mean roughness (Ra) shown in Table 1, under a pressure shown in Table 1, at roll temperature of 30° C. Thereafter, the films cooled during transporting with guide rolls, and then rolled up in the form of a roll, whereby films (thickness: 0.6 mm) for forming a laminate were prepared. In addition, a tension acting on the film during transport was also controlled to obtain the film for forming a laminate. The resultant film has non-embossed surface provided with a surface roughness profile having a mean spacing between peaks (Sm), and an arithmetical mean roughness (Ra) shown in Table 1.

[Evaluation Methods]
(1) Measurement of Tackiness

As the tackiness, an adherence power was measured by a tackiness meter (MODEL: DPX-SOT (manufactured by IMADA Co., LTD), which is determined by bringing non-embossed surface of each film for forming a laminate prepared above into contact with glass plate, and applying load of 500 g for 90 sec on the film, and then peeling off the film at a rate of 300 mm/min. A tackiness of 0.4N or more is set as the acceptable level.

(2) Transferability of the Emboss

A condition of the embossed surface of each film forming a laminate prepared above is visually observed to evaluate the transferability of the emboss as follows.

○: the emboss on the embossed surface is clearly formed.
Δ: the embossed surface slightly has a unclear emboss part.
X: the unclear emboss part is remarkable.

(3) Handling Ability in a Module Laminating Step

Each film forming a laminate prepared above is laminated to produce a solar cell module. A handling ability is evaluated as follows.

○: the film is easy to align in laminating step.
Δ: the film is a little bit difficult to align in laminating step.
X: the film is difficult to align in laminating step.

(4) Measurement of a Surface Roughness Profile with a Mean Spacing Between Peaks (Sm) and an Arithmetical Mean Roughness (Ra)

A surface roughness profile is measured by a surface roughness meter (Surtronic 3+(Rank Taylor Hobson Co., LTD)) according to JIS-B0601 (1994).

TABLE 1

|  | Ex. 1 | Ex. 2 | Ex. 3 | Ex. 4 | Ex. 5 | Ex. 6 | Ex. 7 | Ex. 8 | Comp. Ex. 1 | Comp. Ex. 2 | Comp. Ex. 3 |
|---|---|---|---|---|---|---|---|---|---|---|---|
| Arithmetical mean roughness (Ra) of roll surface of pressure roll made of rubber [μm] | 1.5 | 1.3 | 1.1 | 0.5 | 2.3 | 0.8 | 2.3 | 2.3 | 2.3 | 1.8 | 2.3 |
| Pressure of emboss roll [MPa] | 0.6 | 0.6 | 0.6 | 0.6 | 0.1 | 0.6 | 0.2 | 0.5 | 0.6 | 0.6 | 0 |
| Mean spacing between peaks (Sm) of non-embossed surface of film [μm] | 600 | 800 | 1200 | 1600 | 1600 | 1400 | 1200 | 600 | 400 | 550 | 350 |
| Arithmetical mean roughness (Ra) of roll of non-embossed surface of film [μm] | 2.2 | 1.8 | 1.6 | 1.2 | 1.5 | 1.4 | 1.7 | 2.2 | 2.6 | 2.5 | 3.0 |
| Tackiness of non-embossed surface of film [N] | 0.4 | 0.6 | 0.8 | 1.5 | 0.8 | 1.2 | 1.6 | 0.4 | 0.3 | 0.3 | 0.3 |
| Transferability of the emboss of embossed surface of film | ○ | ○ | ○ | ○ | ○ | ○ | ○ | ○ | ○ | ○ | x |
| Handling ability in module laminating step | ○ | ○ | ○ | Δ | ○ | ○ | ○ | ○ | x | x | x |

[Evaluation Result]

The results are shown in Table 1. In Examples 1 to 8, the films for forming a laminate, in which the non-embossed surface has a surface roughness profile with a mean spacing between peaks (Sm) of 600 to 1600 μm and an arithmetical mean roughness (Ra) of 1.2 to 2.2 μm, has a tackiness of 0.4 to 1.6N, that is acceptable level. Furthermore, the transferability of the emboss, and the handling ability in a module laminating step of the films are also acceptable. However, as to the handling ability in a module laminating step, the film (Example 4), in which the non-embossed surface has a surface roughness profile with a mean spacing between peaks (Sm) of 1600 μm and an arithmetical mean roughness (Ra) of 1.2 μm, is slightly inferior. In contrast, in comparative Examples 1 to 3, the films for forming a laminate, in which the non-embossed surface has a surface roughness profile with a mean spacing between peaks (Sm) and an arithmetical mean roughness (Ra) of out of the range mentioned above, has a tackiness of 0.3N or less, that is rejected, and the films also failed the handling ability in a module laminating step.

As stated above, it is shown that a film for forming a laminate, which is equipped with non-embossed surface having good tackiness, can be obtained by controlling the non-embossed surface of a film provided with emboss only on one surface to have a surface roughness profile of with a mean spacing between peaks (Sm) of the asperity of 600 to 1600 μm and an arithmetical mean roughness (Ra) of 1.2 to 2.2 μm.

The invention is not restricted by the above mentioned Embodiments and Examples. Further, it is possible to make various changes within the scope of the invention.

INDUSTRIAL APPLICABILITY

The use of the ethylene-unsaturated ester copolymer film for forming a laminate of the invention as an intermediate film for a laminated glass and a solar cell sealing film enables the manufacture of a high performance laminated glass and a solar cell with high yield rate.

DESCRIPTION OF THE REFERENCE NUMBERS

5: intermediate film for a laminated glass
7A, 7B: transparent substrate (glass plate)
11: transparent front side protection material
12: backside protection material
13A: front side sealing film
13B: backside sealing film
14: photovoltaic element
21: emboss roll
22: pressure roll made of rubber
23a: first guide roll
23b: second guide roll
23c: third guide roll
24: concavo-convex shape pattern
25: roll surface
30: film (formed film)
31: surface to be embossed
32: non-embossed surface
40: film for forming a laminate

The invention claimed is:

1. A film for forming a laminate, which is formed from a composition comprising an ethylene-unsaturated ester copolymer and which has emboss only on one surface of the film,
wherein a surface opposite to the surface having emboss is provided with a fine asperity, the surface provided with the fine asperity having a surface roughness profile with a mean spacing between peaks (Sm) of 600 to 1600 μm and an arithmetical mean roughness (Ra) of 1.2 to 2.2 μm.

2. The film for forming a laminate as defined in claim 1, wherein the mean spacing between peaks (Sm) of the fine asperity of the surface opposite to the surface having emboss is 600 to 1200 μm.

3. The film for forming a laminate as defined in claim 1, wherein the arithmetical mean roughness (Ra) of the surface opposite to the surface having emboss is 1.7 to 2.2 μm.

4. The film for forming a laminate as defined in claim 1, wherein the ethylene-unsaturated ester copolymer is ethylene-vinyl acetate copolymer.

5. The film for forming a laminate as defined in claim 4, wherein the content of vinyl acetate recurring unit in the ethylene-vinyl acetate copolymer is 20 to 35 parts by weight based on 100 parts by weight of the ethylene-vinyl acetate copolymer.

6. The film for forming a laminate as defined in claim 1, wherein the film is an intermediate film for a laminated glass or a solar cell sealing film.

* * * * *